US009755114B2

United States Patent
Albrecht et al.

(10) Patent No.: US 9,755,114 B2
(45) Date of Patent: Sep. 5, 2017

(54) METHOD FOR PRODUCING A PLURALITY OF OPTOELECTRONIC COMPONENTS AND OPTOELECTRONIC COMPONENT

(71) Applicant: OSRAM Opto Semiconductors GmbH, Regensburg (DE)

(72) Inventors: Tony Albrecht, Bad Abbach (DE); Thomas Schlereth, Regensburg (DE); Albert Schneider, Thalmassing (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/763,157

(22) PCT Filed: Dec. 12, 2013

(86) PCT No.: PCT/EP2013/076431
§ 371 (c)(1),
(2) Date: Jul. 23, 2015

(87) PCT Pub. No.: WO2014/114407
PCT Pub. Date: Jul. 31, 2014

(65) Prior Publication Data
US 2015/0357530 A1 Dec. 10, 2015

(30) Foreign Application Priority Data
Jan. 24, 2013 (DE) .................. 10 2013 100 711

(51) Int. Cl.
*H01L 33/56* (2010.01)
*H01L 33/62* (2010.01)
(Continued)

(52) U.S. Cl.
CPC ............ *H01L 33/502* (2013.01); *H01L 24/97* (2013.01); *H01L 33/0095* (2013.01);
(Continued)

(58) Field of Classification Search
CPC . H01L 33/486; H01L 24/97; H01L 21/76254; H01L 33/56; H01L 33/62; H01L 33/0095; H01L 33/502
(Continued)

(56) References Cited

U.S. PATENT DOCUMENTS

2006/0211159 A1* 9/2006 Bruederl ........... H01L 21/76254
438/35
2009/0173954 A1 7/2009 Beeson et al.
(Continued)

FOREIGN PATENT DOCUMENTS

CN 1813347 A 8/2006
DE 102005041064 A1 3/2007
(Continued)

OTHER PUBLICATIONS

Schnitzer et al: "30% external quantum efficiency from surface textured, thin-film light-emitting diodes"; Appl. Phys. Lett., 63 (15), 18; Oct. 18, 1993, pp. 2174-2176.

*Primary Examiner* — Kenneth Parker
*Assistant Examiner* — Young W Kim
(74) *Attorney, Agent, or Firm* — McDermott Will & Emery LLP

(57) ABSTRACT

The invention relates to a method for producing a plurality of optoelectronic components, comprising the following steps: —providing an auxiliary support wafer (1) having contact structures (4), wherein the auxiliary support wafer comprises glass, sapphire, or a semiconductor material, —applying a plurality of radiation-emitting semiconductor bodies (5) to the contact structures (4), —encapsulating an least the contact structures (4) with a potting mass (10), and —removing the auxiliary support wafer (1). The invention further relates to an optoelectronic component.

15 Claims, 10 Drawing Sheets

Figure 3:
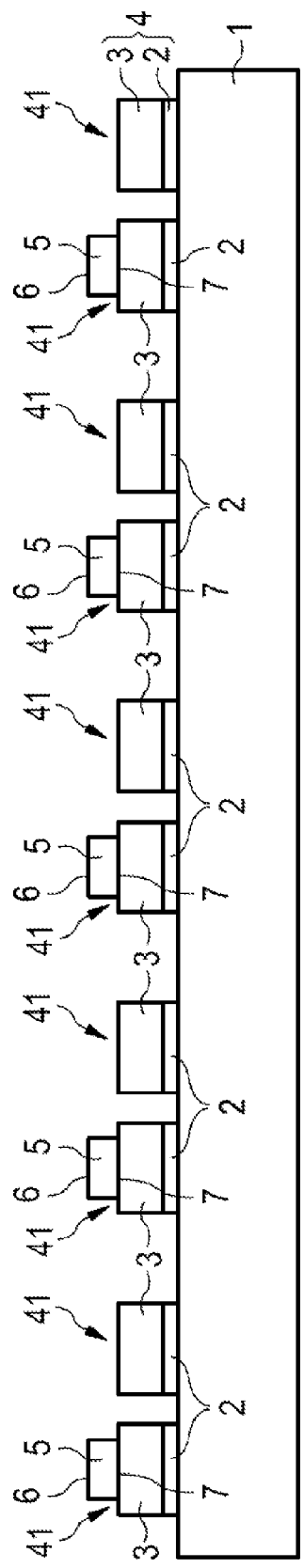

(51) Int. Cl.
  *H01L 33/50* (2010.01)
  *H01L 33/00* (2010.01)
  *H01L 23/00* (2006.01)
  *H01L 33/48* (2010.01)
  *H01L 33/54* (2010.01)
  *H01L 25/075* (2006.01)

(52) U.S. Cl.
  CPC ............ *H01L 33/486* (2013.01); *H01L 33/54* (2013.01); *H01L 33/56* (2013.01); *H01L 33/62* (2013.01); *H01L 25/0753* (2013.01); *H01L 33/50* (2013.01); *H01L 2224/16245* (2013.01); *H01L 2224/48091* (2013.01); *H01L 2224/48137* (2013.01); *H01L 2224/48247* (2013.01); *H01L 2224/49113* (2013.01); *H01L 2924/12041* (2013.01); *H01L 2924/181* (2013.01); *H01L 2924/18301* (2013.01); *H01L 2933/005* (2013.01)

(58) Field of Classification Search
  USPC ........................................ 257/88, 99; 438/35
  See application file for complete search history.

(56) References Cited

U.S. PATENT DOCUMENTS

| 2009/0212316 A1* | 8/2009 | Braune | ............... H01L 24/97 257/99 |
| 2010/0320479 A1 | 12/2010 | Minato et al. | |
| 2011/0121339 A1 | 5/2011 | Wu | |
| 2012/0119233 A1* | 5/2012 | Weidner | ............... H01L 33/486 257/88 |

FOREIGN PATENT DOCUMENTS

| DE | 102008005497 A1 | 7/2009 |
| DE | 102009036621 A1 | 2/2011 |
| DE | 102010027253 A1 | 1/2012 |
| DE | 102011050450 A1 | 11/2012 |
| JP | H11312811 A | 11/1999 |
| JP | 2001501778 A | 2/2001 |
| JP | 2005516415 A | 6/2005 |
| JP | 2007116122 A | 5/2007 |
| JP | 2007220925 A | 8/2007 |
| JP | 2007324205 A | 12/2007 |
| JP | 2008118161 A | 5/2008 |
| JP | 2009506556 A | 2/2009 |
| JP | 2010135693 A | 6/2010 |
| JP | 2011096970 A | 5/2011 |
| JP | 2011181655 A | 9/2011 |
| JP | 2011187979 A | 9/2011 |
| JP | 2012129485 A | 7/2012 |
| JP | 2012151358 A | 8/2012 |
| JP | 2013004807 A | 1/2013 |
| WO | 98/14986 A1 | 4/1998 |
| WO | 01/61764 A1 | 8/2001 |
| WO | 03/065420 A2 | 8/2003 |
| WO | 2007/025515 A1 | 3/2007 |
| WO | WO-2009075530 A2 | 6/2009 |
| WO | WO-2011159456 A2 | 12/2011 |
| WO | 2012/000943 A1 | 1/2012 |

* cited by examiner

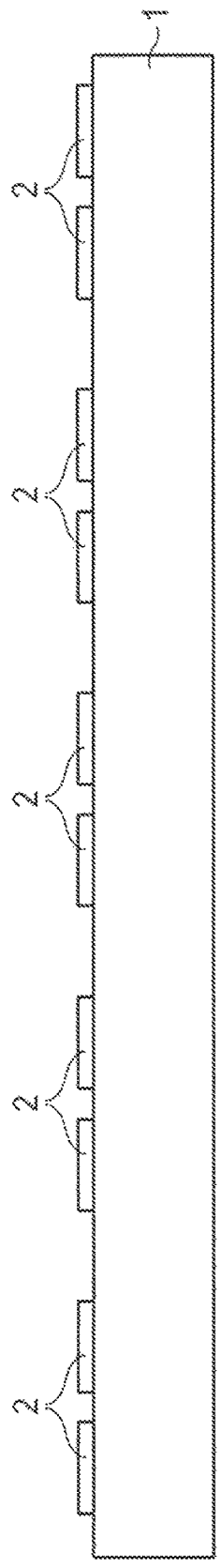
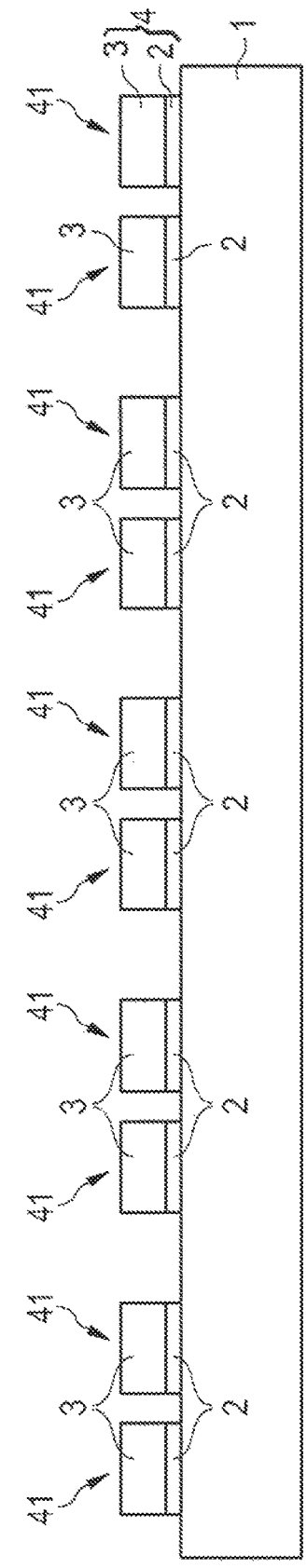

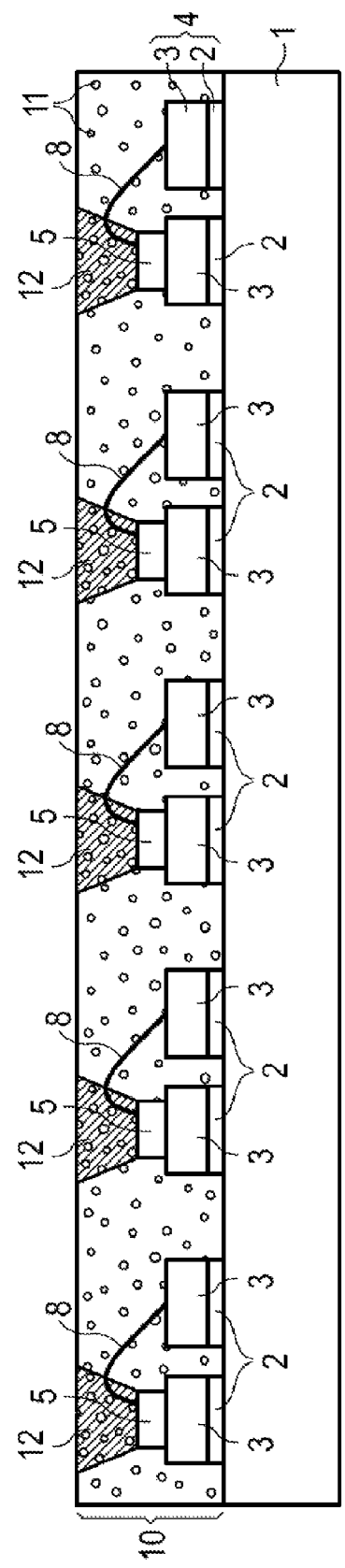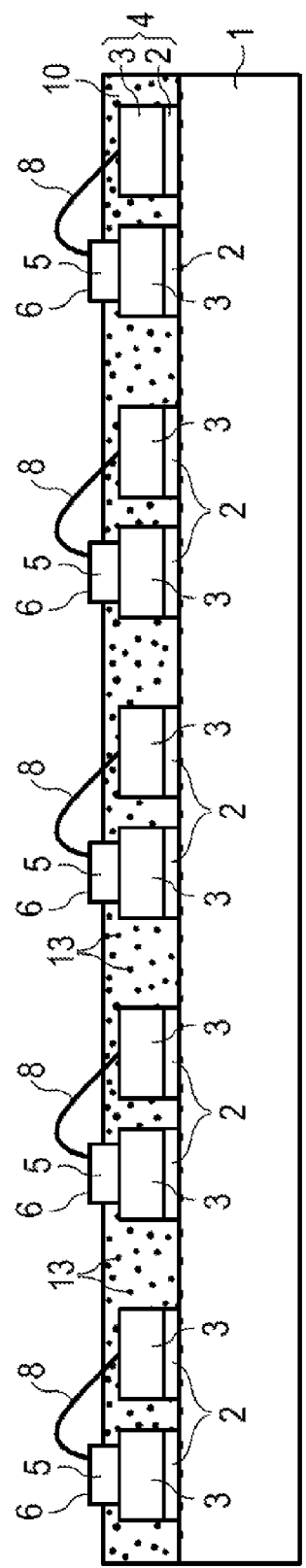

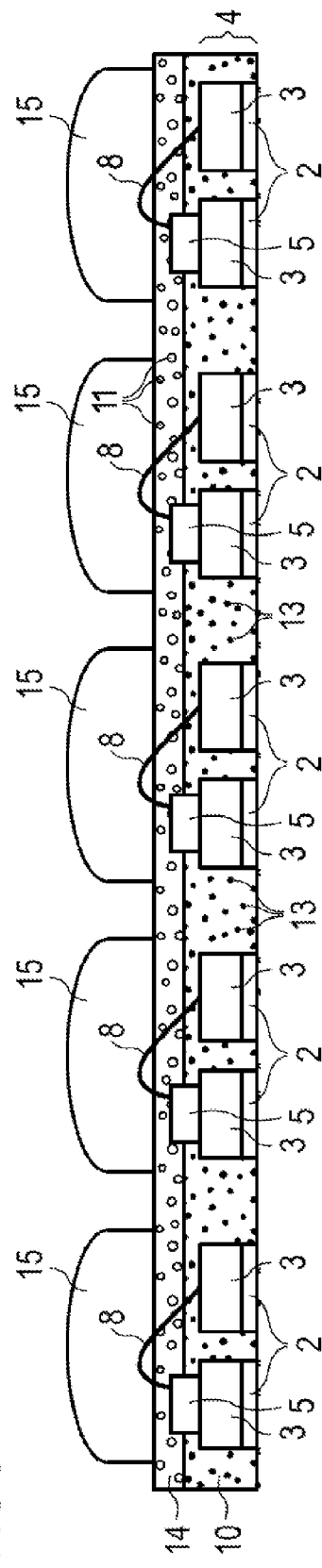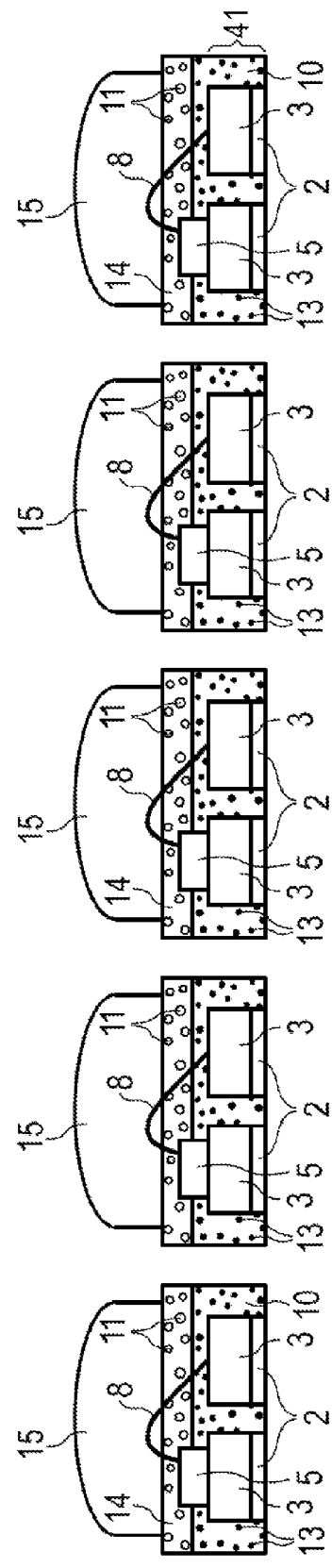

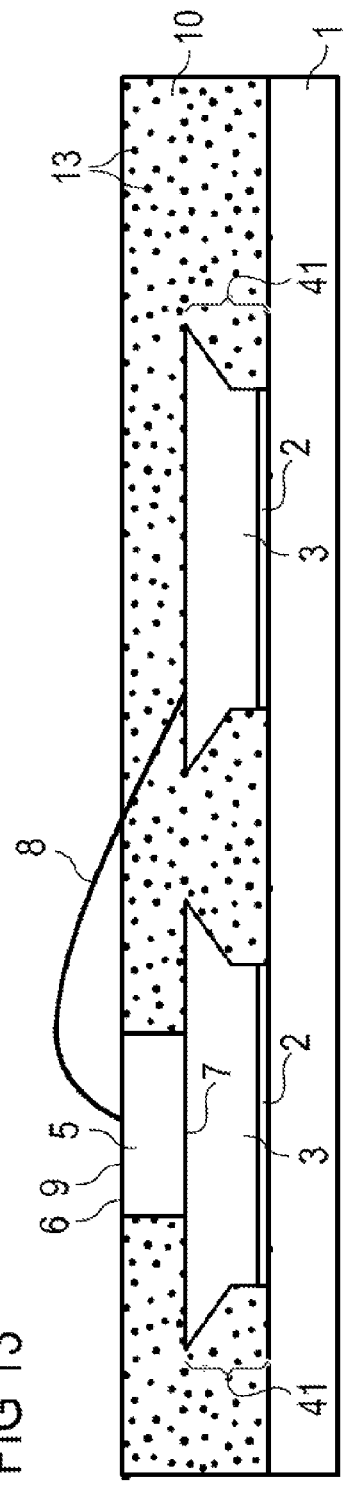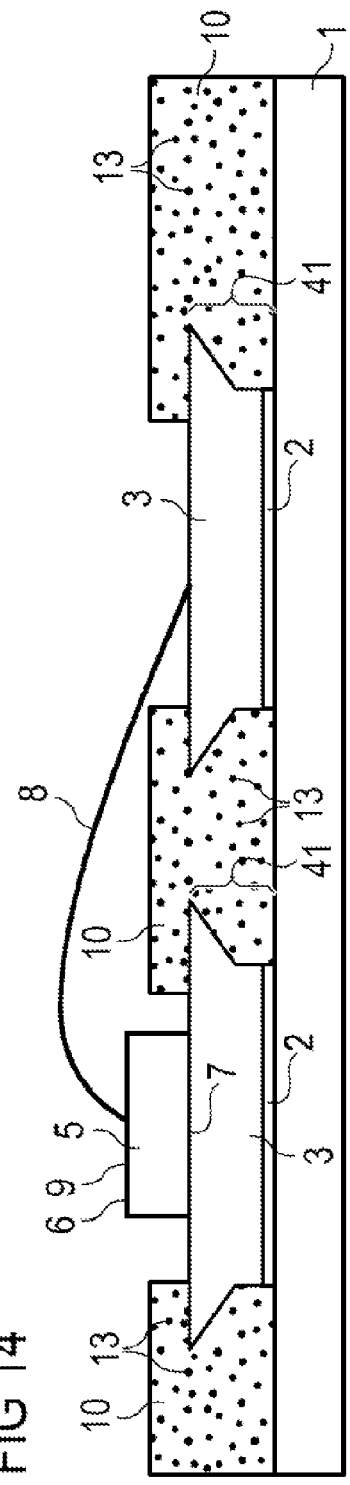

METHOD FOR PRODUCING A PLURALITY OF OPTOELECTRONIC COMPONENTS AND OPTOELECTRONIC COMPONENT

A method for producing a plurality of optoelectronic components and an optoelectronic component are specified.

A method for producing a plurality of optoelectronic components and an optoelectronic component are described, for example, in the following documents: WO 2007/025515, WO 2012/000943.

A cost-effective method is to be specified for producing an optoelectronic component. Furthermore, an optoelectronic component having a compact construction is to be specified.

These objects are achieved by a method having the steps of patent claim 1 and by an optoelectronic component having the features of patent claim 18.

Advantageous refinements and embodiments of the method and of the optoelectronic component are specified in the dependent claims.

In the method for producing a plurality of optoelectronic components, an auxiliary carrier wafer having contact structures is provided. The auxiliary carrier wafer preferably has glass, sapphire, or a semiconductor material, for example, silicon. The auxiliary carrier wafer can also consist of glass, sapphire, or a semiconductor material, for example, silicon. A plurality of radiation-emitting semiconductor bodies is applied to the contact structures. The radiation-emitting semiconductor bodies are capable of emitting electromagnetic radiation of a first wavelength range from a radiation exit surface. At least the contact structures are encapsulated using a potting mass. The auxiliary carrier wafer is preferably removed from the resulting composite. The auxiliary carrier wafer is particularly preferably completely removed from the composite of the later components.

The method makes use of the concept that an auxiliary carrier wafer is used to produce the plurality of optoelectronic components instead of a prefinished housing. The auxiliary carrier wafer is generally no longer contained later in the finished component in this case. The auxiliary carrier wafer is used for the mechanical stabilization of the semiconductor body during the production of the optoelectronic components. Furthermore, the individual method steps for producing the optoelectronic components can take place easily on the wafer level because of the auxiliary carrier wafer. Material and processing costs are thus advantageously saved and overall optimization of the individual process steps of the production method is possible. In addition, the individual manufacturing units, for example, the auxiliary carrier wafer, can be easily scaled.

Furthermore, a particularly compact and/or flat construction of the finished components is achieved using the proposed method. A compact construction advantageously results in very good heat dissipation from the semiconductor body in operation of the finished component.

Furthermore, using the proposed method, the use of prefinished conductor frames or ceramic panels for mechanical stabilization of the semiconductor bodies can advantageously be omitted. The use of through-contacted silicon panels is advantageously also not necessary in the proposed method. The finished component is particularly preferably free of a conventional housing.

The contact structures are particularly preferably used for the later electrical contacting of the semiconductor bodies. The contact structures are constructed, for example, from individual contact structure elements, which are electrically insulated from one another. Particularly preferably, two contact structure elements are associated with each semiconductor body. In particular if each later component has a single semiconductor body, precisely two contact structure elements are preferably associated with each individual semiconductor body.

Each semiconductor body is particularly preferably attached using a mounting surface, which is opposite to its radiation exit surface, in an electrically conductive manner to a contact structure element. The radiation exit surface of the semiconductor body is generally part of a front side of the semiconductor body in this case, which can have partial regions, however, for example, a bond pad, from which radiation cannot exit. The front side is opposite to the mounting surface.

For example, the contact structures have a first metallic layer and a second metallic layer, wherein the second metallic layer is galvanically deposited on the first metallic layer. The first metallic layer particularly preferably has a thickness between 50 nm inclusive and 500 nm inclusive. The first metallic layer can have one of the following materials or can consist of one of the following materials, for example: gold, nickel.

The first metallic layer is also referred to as a growth layer ("seed layer"). It does not necessarily have to consist of a single layer. Rather, it is also possible that the first metallic layer is a layer sequence made of multiple individual layers which are different from one another. For example, the first metallic layer can comprise a gold individual layer and a nickel individual layer or can consist of a gold individual layer and a nickel individual layer.

The second metallic layer is particularly preferably thicker than the first metallic layer. The second metallic layer particularly preferably has a thickness between 10 μm inclusive and 100 μm inclusive. For example, the second metallic layer has a thickness of approximately 60 μm. The second metallic layer particularly preferably has one of the following materials or is formed from one of the following materials: silver, gold, nickel, copper.

The second metallic layer does not necessarily have to consist of a single layer. Rather, it is also possible that the second metallic layer is a layer sequence made of multiple individual layers which are different from one another. For example, the second metallic layer can comprise a silver individual layer and a nickel individual layer or can consist of a silver individual layer and a nickel individual layer.

It is also possible that the second metallic layer comprises a gold individual layer and a nickel individual layer or consists of a gold individual layer and a nickel individual layer.

Furthermore, the second metallic layer can comprise a nickel individual layer, a copper individual layer, a further nickel individual layer, and a silver individual layer or can consist of these individual layers. The second metallic layer preferably has these individual layers in the sequence as specified above in this case, i.e., in the sequence nickel-copper-nickel-silver. The silver individual layer can also be replaced by a gold individual layer in this case.

The second metallic layer particularly preferably has lateral flanks having an undercut. For example, the lateral flanks of the second metallic layer are implemented as inclined in relation to a normal of a main surface of the second metallic layer over a partial region or over the entire length thereof, wherein the cross-sectional area of the second metallic layer tapers from a main surface facing toward the semiconductor body toward a main surface facing away from the semiconductor body. The potting mass particularly preferably encloses both the semiconductor bodies and also the contact structures in a formfitting manner. The potting mass particularly preferably forms a shared interface with the semiconductor bodies and the contact structures. A second metallic layer having lateral flanks having an undercut advantageously contributes to better fixation of the potting mass within the later component.

According to one embodiment of the method, in addition to the radiation-emitting semiconductor bodies, further active elements, for example, ESD diode chips (ESD stands for "electrostatic discharge" in this case) are attached to the auxiliary carrier wafer. For example, each later component can have an ESD diode chip, which is provided to protect the component from excessive electrical voltages.

According to one embodiment of the method, the potting mass is implemented as reflective and/or wavelength-converting. The potting mass particularly preferably has a matrix material, for example, an epoxy, a silicone, a polyphthalanide (PPA), a polycyclohexylene dimethylene terephthalate (PCT), or a mixture of at least two of these materials. To implement the potting mass as reflective, for example, reflective particles are embedded in the matrix material. The reflective particles can contain one of the following materials or consist of one of the following materials, for example: titanium oxide, zinc white, for example, zinc oxide, lead white, for example, lead carbonate.

Furthermore, the potting mass can also be implemented as wavelength-converting, additionally or alternatively to the reflective properties. The wavelength-converting potting mass is preferably capable of converting electromagnetic radiation of the first wavelength range into electromagnetic radiation of a second wavelength range. For this purpose, for example, phosphor particles are introduced into the matrix material of the potting mass, which are capable of converting electromagnetic radiation of the first wavelength range into electromagnetic radiation of the second wavelength range. In other words, the phosphor particles preferably provide the potting mass with the wavelength-converting properties.

"Wavelength conversion" is understood in the present case in particular as the conversion of incident electromagnetic radiation of a specific wavelength range into electromagnetic radiation of another, preferably longer-wave wavelength range. In particular, during the wavelength conversion, electromagnetic radiation of an incident wavelength range is absorbed by the wavelength-converting element, converted by electronic processes at the atomic and/or molecular level into electromagnetic radiation of another wavelength range, and emitted again. In particular, the term "wavelength conversion" does not mean solely scattering or solely absorption of electromagnetic radiation in the present case.

The phosphor particles can have one of the following materials or consist of one of the following materials, for example: garnets doped with rare earth elements, alkaline earth sulfides doped with rare earth elements, thiogallates doped with rare earth elements, aluminates doped with rare earth elements, silicates doped with rare earth elements, orthosilicates doped with rare earth elements, chlorosilicates doped with rare earth elements, alkaline earth silicon nitrides doped with rare earth elements, oxynitrides doped with rare earth elements, aluminum oxynitrides doped with rare earth elements, silicon nitrides doped with rare earth elements, sialons doped with rare earth elements.

The potting mass can be processed, for example, using one of the following methods: casting, dispensing, jetting, molding.

The auxiliary carrier wafer can be removed by one of the following methods, for example: laser liftoff, etching, grinding. In general, the auxiliary carrier wafer is removed in this case from an interface, which is partially formed by a surface of the contact structures and is partially formed by a surface of the potting mass. In other words, the auxiliary carrier wafer generally forms a shared interface, which is freely accessible after the removal of the auxiliary carrier wafer, with the contact structures and with the potting mass.

An auxiliary carrier wafer, which is transmissive to electromagnetic radiation of a laser, is particularly preferably removed by means of a laser liftoff process. The particular advantage in this case is that the auxiliary carrier wafer is essentially not destroyed during the laser liftoff process, so that the auxiliary carrier wafer can optionally be reused after corresponding conditioning.

A laser liftoff process is described, for example, in one of the following documents, the content of the disclosure of which in this regard is hereby incorporated by reference: WO 98/14986, WO 03/065420.

In particular, a carrier which has sapphire or glass or consists of sapphire or glass is preferably removed using a laser liftoff process.

An auxiliary carrier wafer which has a semiconductor material, for example, silicon or consists of this material, is generally removed by means of etching or grinding, in contrast. In this case, the auxiliary carrier wafer is generally destroyed and cannot be reused.

After the removal of the auxiliary carrier wafer, the resulting composite made of optoelectronic components is generally isolated and the colorimetric locus of the light emitted by the components is measured.

According to a further embodiment of the method, a wavelength-converting layer is arranged in a light path of the semiconductor bodies. In this case, the wavelength-converting layer can be provided in addition to a reflective potting mass. For example, the wavelength-converting layer is applied to the entire area on the reflective potting mass. The wavelength-converting layer has wavelength-converting properties. For this purpose, the wavelength-converting layer generally contains phosphor particles, which are capable of converting radiation of the first wavelength range into electromagnetic radiation of the second wavelength range.

The wavelength-converting layer can be implemented, for example, as a layered wavelength-converting potting mass. In other words, the wavelength-converting layer can have, for example, a matrix material, into which phosphor particles are introduced. The matrix material having the phosphor particles can be implemented in the form of a wavelength-converting layer by casting or printing, for example. For example, the wavelength-converting layer can be printed or cast on the potting mass.

Furthermore, it is also possible that the wavelength-converting layer is created by a sedimentation method, in particular on the potting mass.

In a sedimentation method, phosphor particles are introduced into a matrix material. The surface to be coated is provided in a volume which is filled with the matrix material having the phosphor particles. Subsequently, the phosphor particles accumulate in the form of a wavelength-converting layer on the surface to be coated because of gravity. The settling of the phosphor particles can be accelerated in this case by centrifuging. The use of a diluted matrix material also generally accelerates the sedimentation process. After the sinking of the phosphor particles, the matrix material is cured.

A characteristic of a wavelength-converting layer which was applied by means of a sedimentation method is that all surfaces on which the particles can accumulate because of gravity are coated with the wavelength-converting layer. Furthermore, the phosphor particles of a sedimentary wavelength-converting layer are generally in direct contact with one another.

The wavelength-converting layer can furthermore be created separately, i.e., spatially remote, from the composite of later optoelectronic components and can then be introduced into a light path of the semiconductor bodies. For example, the matrix material having the phosphor particles can be printed in the form of a layer onto a film and then cured, so that a wavelength-converting layer results. The wavelength-converting layer can then be introduced by means of a pick-and-place method into the light path of the semiconductor bodies. For example, the wavelength-converting layer can be placed on the potting mass.

According to a further embodiment of the method, an optical element is arranged in each case in the light path of each semiconductor body. For example, a lens is positioned above each semiconductor body downstream in the emission direction thereof. The optical element can be molded above the semiconductor bodies, for example, i.e., created with the aid of a cavity. The optical element can be created, for example, using one of the following methods: injection molding, casting, transfer molding, compression molding.

The semiconductor bodies can be implemented as flip-chips, for example. A flip-chip has in particular two electrical contacts on a mounting surface of the semiconductor body, while a radiation-emitting front side of the flip-chip is free of electrical contacts. In particular, flip-chips generally do not require a bond wire for the electrical contacting. The electrical contacts of the flip-chip are generally provided for mounting the flip-chip on contact structures.

Furthermore, however, semiconductor bodies having one or two electrical contacts on the front side, which is opposite to the mounting surface thereof, can also be used. Such semiconductor bodies can have a sapphire substrate, for example, on which a radiation-emitting semiconductor layer sequence of the semiconductor body is epitactically grown. Such semiconductor bodies are also referred to as "sapphire chips". Sapphire is generally an electrically insulating material. If the semiconductor body therefore has a growth substrate, which has sapphire or consists of sapphire, at least two electrical contacts are thus generally arranged on the front side of the semiconductor body for the electrical contacting. The mounting surface is generally formed by an external surface of the growth substrate.

Furthermore, semiconductor bodies which only have a single electrical contact on the front side thereof are also suitable. The second electrical contact is arranged, for example, on the mounting surface of the semiconductor body or formed by the mounting surface. Such semiconductor bodies are also referred to as "vertical" semiconductor bodies, since the current flow in operation extends through the semiconductor body in the vertical direction in parallel to a stack direction of the semiconductor layer sequence.

A vertical semiconductor body can be, for example, a thin-film semiconductor body. In a thin-film semiconductor body, a growth substrate for the epitactic semiconductor layer sequence is generally either completely removed or thinned such that it no longer sufficiently mechanically stabilizes the epitactic semiconductor layer sequence alone. Thin-film semiconductor bodies generally comprise a carrier material, which is fastened on the epitactic semiconductor layer sequence, for mechanical stabilization. The carrier material is generally implemented as electrically conductive, so that a vertical current flow is possible from the front side to the mounting surface of the semiconductor body. Thin-film semiconductor bodies are disclosed, for example, in the document I. Schnitzer et al., Appl. Phys. Lett. 63 (16), 18 Oct. 1993, 2174-2176, the content of the disclosure of which is hereby incorporated by reference.

Furthermore, semiconductor bodies which have a growth substrate, which consists of silicon carbide or has silicon carbide, are generally also implemented as vertical semiconductor bodies. A vertical current flow is also possible in this case, since silicon carbide is implemented as electrically conductive. Such semiconductor bodies are described, for example, in document WO 01/61764, the content of the disclosure of which is hereby incorporated by reference.

Later components, which only have a single vertical semiconductor body, generally comprise contact structures having two structure elements. The vertical semiconductor body is generally attached in this case in an electrically conductive manner having its mounting surface on a first contact structure element and is connected in an electrically conductive manner via its front side to a second contact structure element by means of a bond wire.

If the semiconductor body is a flip-chip, the rear electrical contacts are generally each connected in an electrically conductive manner to a contact structure element.

If the semiconductor body has at least two electrical contacts on the front side, wherein the mounting surface of the semiconductor body is free of electrical contacts, the semiconductor body can thus be connected, for example, in an electrically conductive manner to an electrical contact structure element on the front in each case using a bond wire.

According to a further embodiment of the method, an upper edge of the potting mass extends up to an upper edge of the second metallic layer. In this case, the second metallic layer particularly preferably forms an outer side of the contact structures. The potting mass particularly preferably terminates flush with an upper side of the second metallic layer in this case. The potting mass particularly preferably covers the lateral surfaces of the second metallic layer, while the lateral surfaces of the semiconductor body are free of the potting mass. In this embodiment of the method, the application of the potting mass can be performed before or after the application of the semiconductor bodies to the auxiliary carrier wafer.

According to a further embodiment of the method, the upper edge of the potting mass extends up to an upper edge of the semiconductor bodies. In this case, the potting mass particularly preferably terminates flush with the front side of the semiconductor bodies. The potting mass particularly preferably completely covers each of the lateral surfaces of the semiconductor bodies in this case, but does not protrude beyond the front side of the semiconductor bodies. This embodiment is advantageous if a reflective potting mass is used in particular in the case of a semiconductor body which is not provided for emitting electromagnetic radiation via its lateral surfaces, for example a thin-film semiconductor body having a silicon or germanium carrier. In this embodiment of the method, the potting mass is applied after the application of the semiconductor bodies to the auxiliary carrier wafer.

Furthermore, it is also possible that the upper edge of the potting mass extends beyond the second metallic layer, but does not extend up to the upper edge of the semiconductor body. In this case, it is also possible that the potting mass does completely encapsulate the lateral flanks of the contact structures, but the lateral surfaces of the semiconductor body are arranged spaced apart from the potting mass. In this embodiment of the method, the application of the potting mass can also be performed before or after the application of the semiconductor bodies to the auxiliary carrier wafer.

If a reflective potting mass is used, the lateral surfaces of the semiconductor body are particularly preferably arranged spaced apart from the potting mass or are free of the potting mass, if radiation of the semiconductor body can also be emitted via the lateral surfaces of the semiconductor body, as is the case in particular with a semiconductor body having a radiation-transmissive growth substrate, such as sapphire or silicon carbide.

According to a further embodiment of the method, a mechanically stabilizing material is molded around the contact structures. The mechanically stabilizing material is particularly preferably used for stabilizing the finished optoelectronic component and fulfills the function of a housing, for example. In contrast to a conventional housing, however, the mechanically stabilizing material is not implemented as a separate element, onto or into which the semiconductor body is mounted.

The mechanically stabilizing material is particularly preferably molded around the contact structures before the plurality of semiconductor bodies are encapsulated using the potting mass. The mechanically stabilizing material is, for example, a high-stability housing material, such as high-stability polyphthalamide (PPA) or high-stability epoxy.

The mechanically stabilizing material particularly preferably forms a shared interface with the contact structures. An upper edge of the mechanically stabilizing material particularly preferably terminates flush laterally with an upper edge of the contact structures.

The potting mass material, which is molded around the semiconductor bodies, is particularly preferably applied subsequently to the mechanically stabilizing material.

The mechanically stabilizing material can particularly preferably be implemented as molded around the contact structures, for example, by means of molding, i.e., with the aid of a casting tool, which is particularly preferably implemented as flat.

According to a further embodiment of the method, each later component has a plurality of semiconductor bodies. For example, the semiconductor bodies can be provided for emitting light of different wavelengths.

The later optoelectronic components can be, for example, light-emitting diodes.

According to one embodiment, the finished components are provided to emit white light. For this purpose, each component generally comprises a wavelength-converting element, for example, a wavelength-converting layer or a wavelength-converting potting mass. The wavelength-converting element preferably converts a part of the electromagnetic radiation of the first wavelength range emitted by the semiconductor body into electromagnetic radiation of the second wavelength range. The first wavelength range preferably comprises blue light and the second wavelength range preferably comprises yellow light. In this case, the component preferably emits mixed-color white light, which is formed from unconverted blue light and converted yellow light.

Further advantageous embodiments and refinements of the invention result from the exemplary embodiments described hereafter in conjunction with the figures.

A first exemplary embodiment of the method is described on the basis of the schematic sectional illustrations of FIGS. 1 to 5.

A further exemplary embodiment of the method is described on the basis of the schematic sectional illustrations of FIGS. 6 to 10.

A further exemplary embodiment of the method is described in each case on the basis of the schematic sectional illustrations of FIGS. 11 and 13 to 19.

Figure 12:
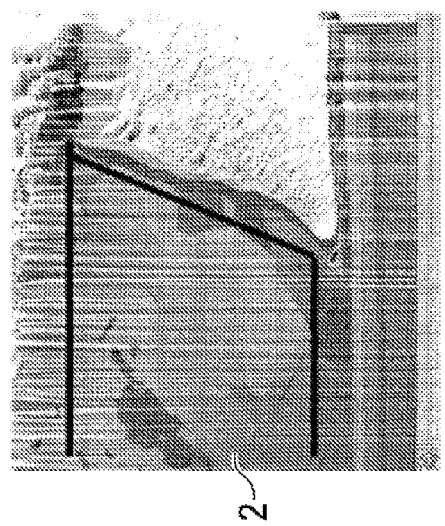

FIG. 12 shows an example of an electron microscope picture of an undercut of a second metallic layer.

Identical, similar, or identically acting elements are provided with the same reference signs in the figures. The figures and the size relationships of the elements illustrated in the figures among one another are not to scale. Rather, individual elements, in particular layer thicknesses, can be shown exaggeratedly large for better illustration ability and/or for better comprehension.

In the method according to the exemplary embodiment of FIGS. 1 to 5, an auxiliary carrier wafer 1 is provided in a first step (FIG. 1). The auxiliary carrier wafer 1 has in particular glass, sapphire, or a semiconductor material, for example, silicon. A first metallic layer 2 is applied to the auxiliary carrier wafer 1. The first metallic layer 2 is implemented as structured. In other words, the first metallic layer 2 has various structural elements.

In a further step, a second metallic layer 3 is galvanically deposited on the first metallic layer 2 (FIG. 2). The second metallic layer 3 is also implemented as structured. The structuring of the second metallic layer 3 follows the structuring of the first metallic layer 2 in this case. The first metallic layer 2 and the second metallic layer 3 together form contact structures 4 having individual contact structure elements 41.

In a further step, a plurality of semiconductor bodies 5, which are capable of emitting electromagnetic radiation from the radiation exit surface 6 thereof, are now applied to the contact structures 4 (FIG. 3). Each semiconductor body 5 is applied in this case with a mounting surface 7 on a contact structure 41 in an electrically conductive manner, for example, by gluing, soldering, or die bonding.

Figure 4:
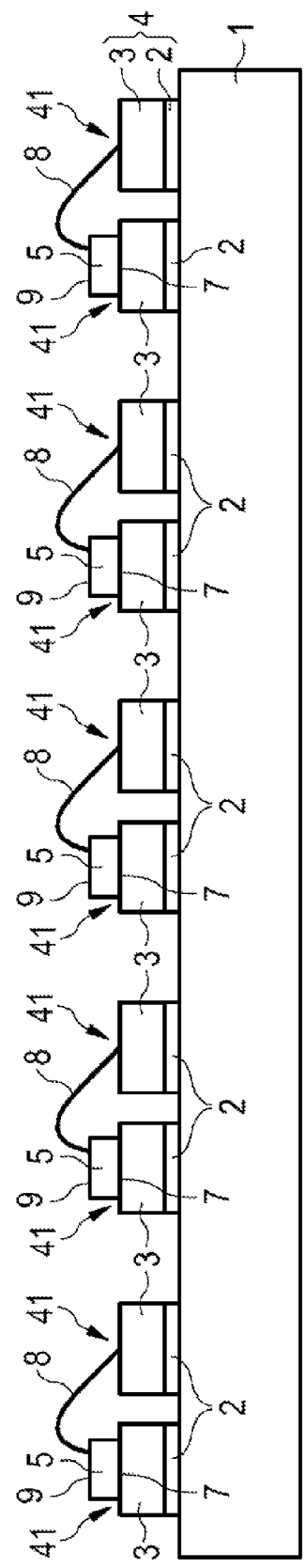

In a next step, each semiconductor body 5 is now connected with its front side 9 by means of a bond wire 8 in an electrically conductive manner to a further contact structure element 41 (FIG. 4).

In a next step, a potting mass 10 is applied to the auxiliary carrier wafer 1, so that the contact structures 4 and the semiconductor bodies 5 are encapsulated using the potting mass 10 (FIG. 5). The potting mass 10 completely encloses in this case both the contact structure elements 41 of the contact structures 4 and also the semiconductor bodies applied thereon. The bond wires 9 are also completely enclosed by the potting mass 10. The potting mass 10 protrudes beyond the radiation exit surface 6 of the semiconductor bodies 5 and is located in a light path 12 of the semiconductor bodies 5.

In the present exemplary embodiment, the potting mass 10 is implemented as layered. The layer of the potting mass has an essentially constant thickness in this case. Furthermore, the potting mass 10 is implemented as wavelength-converting in the present exemplary embodiment. For this purpose, the potting mass 10 comprises a matrix material having phosphor particles 11, which are capable of converting radiation of a first wavelength range, which is emitted from the semiconductor bodies 5, into electromagnetic radiation of a second wavelength range. Since the potting mass 10 is located in the light path 12 of the semiconductor bodies 5, the electromagnetic radiation of the first wavelength range, which is emitted from the semiconductor bodies 5, is partially converted into electromagnetic radiation of a second wavelength range. In the present case, the semiconductor bodies 5 particularly preferably emit blue light, which is partially converted by the phosphor particles in the potting mass 10 into yellow light. The finished components emit mixed-color white light in the present exemplary embodiment.

In a next step, the auxiliary carrier wafer 1 is detached from the composite of the later components, the contact structures 4, semiconductor bodies 5, and wavelength-converting potting mass 10 (not shown). Subsequently, the later components, which each comprise a single semiconductor body 5, are isolated (not shown).

In the method according to the exemplary embodiment of FIGS. 6 to 10, firstly the method steps which were already described on the basis of FIGS. 1 to 4 are carried out. A potting mass 10 is then applied to the auxiliary carrier wafer 1, which completely encapsulates the contact structures 4 and partially encapsulates the semiconductor bodies 5 (FIG. 6). A partial region of the lateral flanks of the semiconductor bodies 5 and the radiation exit surface 6 of the semiconductor bodies 5 remain free of the potting mass 10. The potting mass 10 is implemented as reflective in the present exemplary embodiment. For this purpose, the potting mass 10 comprises a matrix material, into which reflective particles 13, for example, titanium oxide particles, are introduced.

Figure 7:
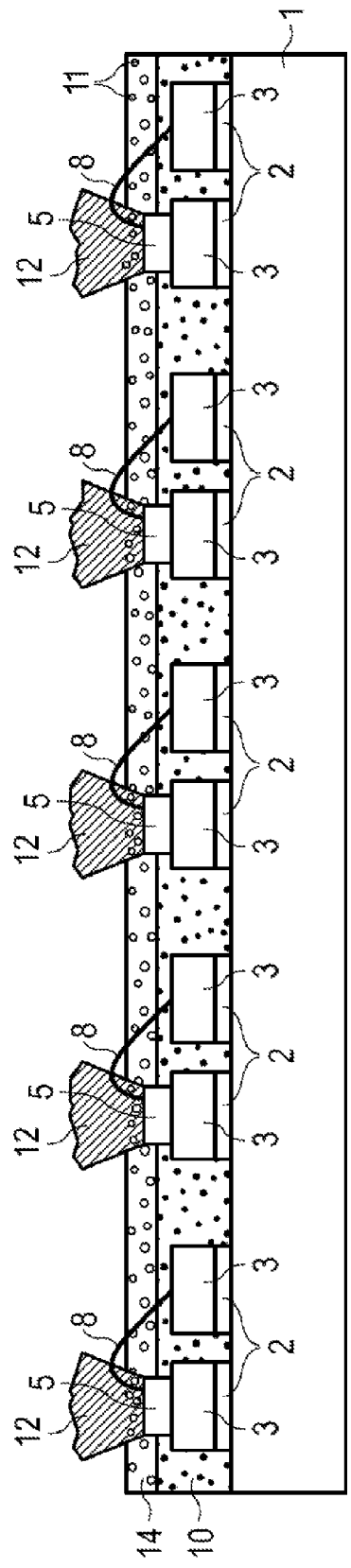

In a next step, a wavelength-converting layer 14 is applied to the reflective potting mass 10 (FIG. 7). The wavelength-converting layer 14 encloses in this case the regions of the lateral surfaces of the semiconductor body 5 which are not enclosed by the reflective potting mass 10. Furthermore, the wavelength-converting layer 14 protrudes beyond the semiconductor bodies 5, so that it is located at least partially in the light path 12 of the semiconductor bodies 5.

The wavelength-converting layer 14 comprises a matrix material, into which phosphor particles 11 are introduced. The phosphor particles 11 provide the wavelength-converting layer 14 with its wavelength-converting properties.

Figure 8:
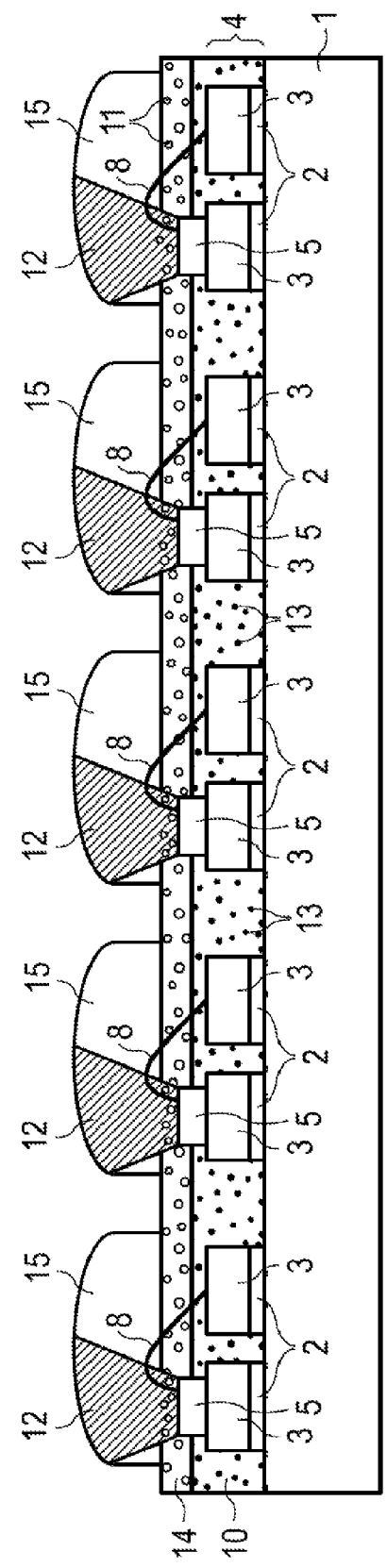

In a next step, a plurality of optical elements 15 is applied to the wavelength-converting layer 14 (FIG. 8). The optical elements 15 are each implemented as a lens. Each optical element 15 is positioned over one semiconductor body 5 in each case and is located in the light path 12 thereof. The optical element 15 can, for example, be molded onto the wavelength-converting layer 14, i.e., implemented by means of a cavity.

In a next step, the auxiliary carrier wafer 1 is completely removed from the composite of the later semiconductor components (FIG. 9). If the auxiliary carrier wafer 1 is a sapphire substrate or a glass carrier, it can thus be removed by means of a laser liftoff process. If a silicon carrier is used as the auxiliary carrier wafer 1, it is thus generally removed destructively, i.e., by means of grinding or etching, for example, from the composite of the later components. In a further step, the components are isolated (FIG. 10).

Figure 11:
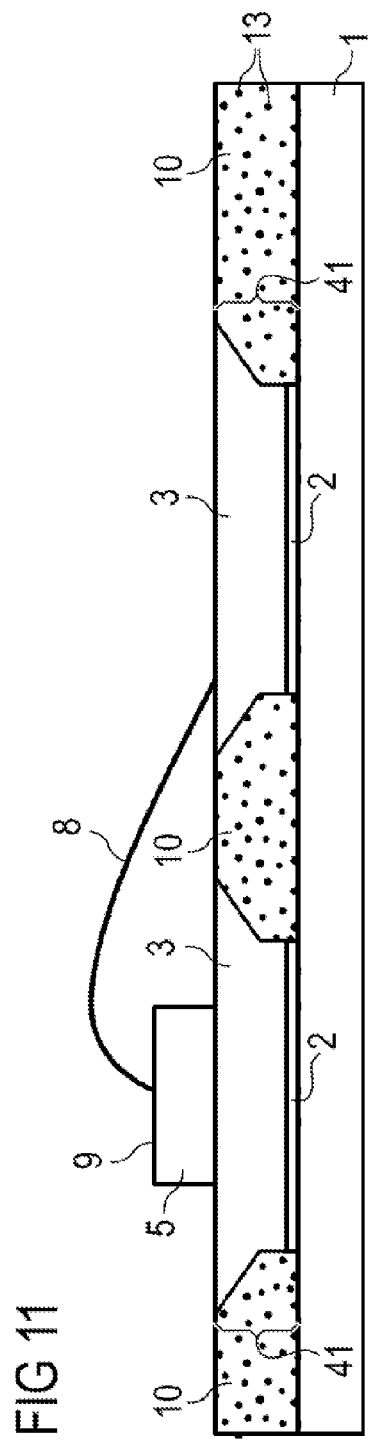

In the method according to the exemplary embodiment of FIG. 11, as in the preceding exemplary embodiments, an auxiliary carrier wafer 1 is provided, onto which contact structures 4 are applied. FIG. 11 shows in this case a portion of the auxiliary carrier wafer 1, which contains a semiconductor body 5 and corresponds to a finished component. The contact structures 4 comprise multiple contact structure elements 41, wherein a radiation-emitting semiconductor body is applied to a contact structure element 41. The semiconductor body 5 is connected in an electrically conductive manner on the front to a further contact structure element 41 using a bond wire 8.

The contact structures 4 have a first metallic layer 2 and a second metallic layer 3. In contrast to the above-described exemplary embodiments, the second metallic layer 2 has lateral flanks having an undercut. Each contact structure element 41 has lateral flanks in this case, which extend inclined in relation to a normal of the auxiliary carrier wafer 1 over a partial region. Because of the inclined lateral flanks of the second metallic layer 3, the contact structure element 41 tapers from an outer surface of the contact structure element 41 toward the auxiliary carrier wafer 1. The undercut of the second metallic layer 3 is provided to anchor the potting mass 10 better. The reflective potting mass 10 is applied in the present case up to an upper edge of the second metallic layer 2. A surface of the reflective potting mass 10 terminates flush with a surface of the contact structures 4.

FIG. 12 shows an example of an electron microscope picture of an undercut of a lateral flank of a second metallic layer 2.

In the method according to the exemplary embodiment of FIG. 13, in contrast to the exemplary embodiment according to FIG. 11, the reflective potting mass 10 is applied up to the radiation exit surface 6 of the semiconductor body 5. The surface of the potting mass 10 terminates flush with the radiation exit surface 6 of the semiconductor body 5.

In the method according to the exemplary embodiment of FIG. 14, the reflective potting mass 10 is applied, in contrast to the method of the exemplary embodiments of FIGS. 11 and 13, such that the surface of the potting mass is located below the radiation exit surface 6 of the semiconductor body 5. The potting mass 10 does encapsulate the metallic contact structures 4 over their entire height in this case, so that the lateral flanks of the contact structures 4 are completely enclosed by the potting mass 10, however, an air gap is implemented between the lateral surfaces of the semiconductor body 5 and the potting mass 10.

In the above-described exemplary embodiments, vertical semiconductor bodies 5 are used in each case, which are connected in an electrically conductive manner on the rear via a mounting surface 7 to a first contact structure element 41 and on the front to a second contact structure element 41. The electrically conductive connection from the front side 9, which is opposite to the mounting surface 7, of the semiconductor body 5 to the contact structure element 41 is performed in this case via a bond wire 8.

Figure 15:
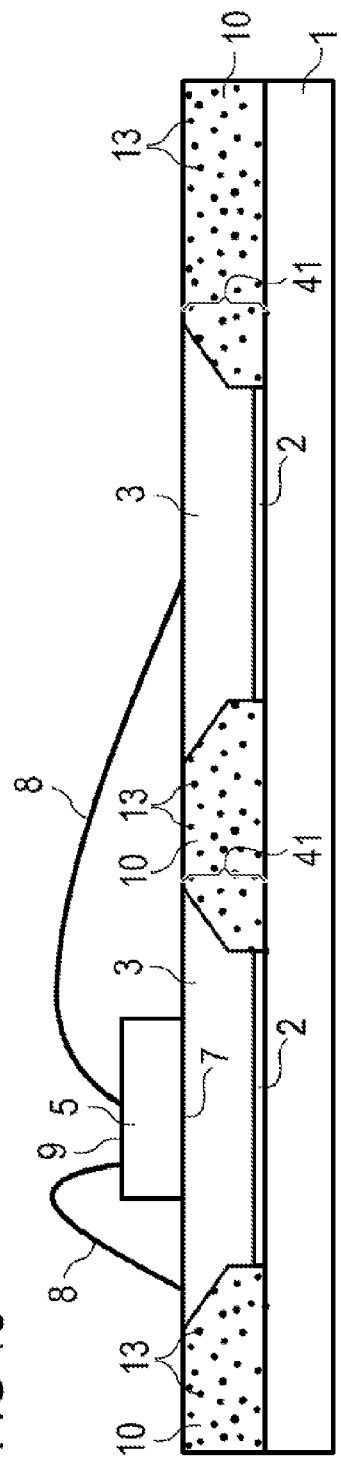

In contrast to the exemplary embodiment of FIG. 11, a semiconductor body 5 is used in the exemplary embodiment according to FIG. 15, in which two electrical contacts are arranged on its front side 9. The semiconductor body 5 is, for example, a sapphire chip. The semiconductor body 5 is connected in a conductive manner on the front using two bond wires 8 to a contact structure element 41 in each case.

Figure 16:
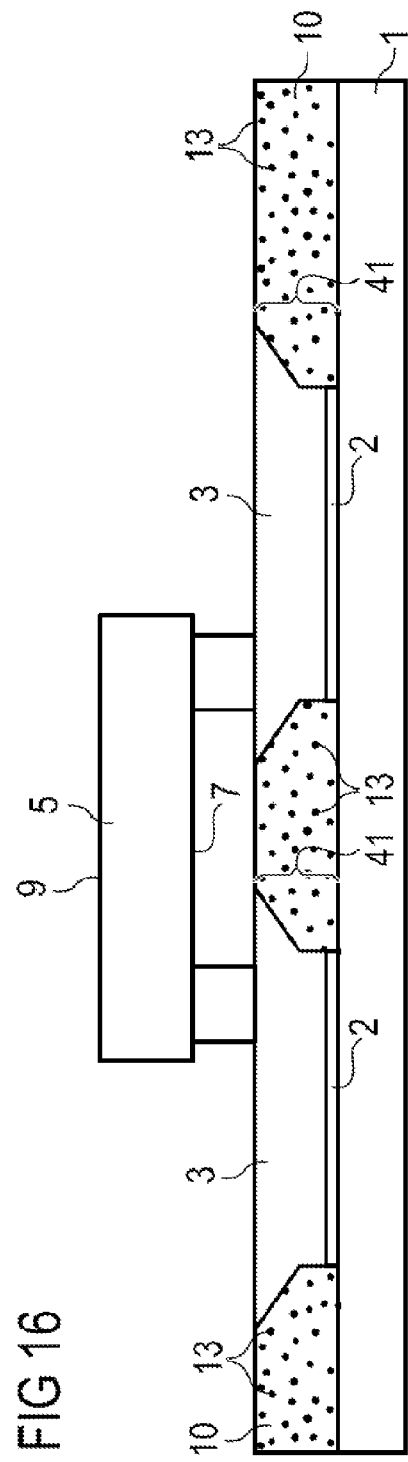

In contrast to the exemplary embodiments of FIGS. 11 and 15, in the exemplary embodiment according to FIG. 16, a flip-chip is used as the semiconductor body 5. The flip-chip has two electrical contacts on its mounting surface 7, which are each connected in an electrically conductive manner to a contact structure element 41, for example, by means of soldering.

Figure 17:
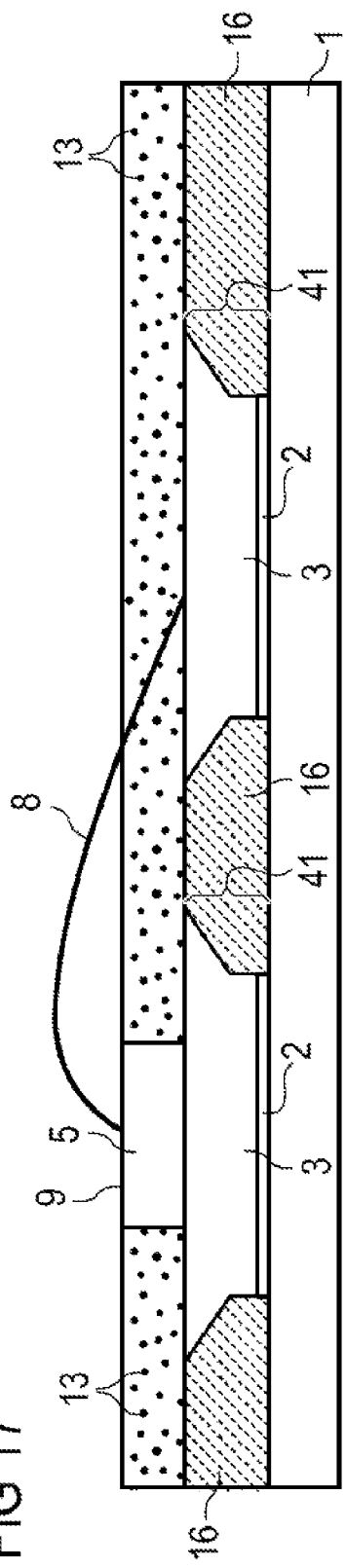

In the exemplary embodiment according to FIG. 17, in contrast to the above-described exemplary embodiments, a mechanically stabilizing material 16, for example, a housing material, is molded around the contact structure elements 41. The mechanically stabilizing material 16 terminates flush with a surface of the contact structure elements 41 in this case. Furthermore, a potting mass 10, which is implemented as reflective in the present case, is applied to the surface which is formed by the contact structure elements 41 and the surface of the mechanically stabilizing material 16. The reflective potting mass 10 is applied in this case in the form of a layer to the contact structure elements 41 or the housing material 16 and terminates flush with a front side 9 of the semiconductor body 5.

Figure 18:
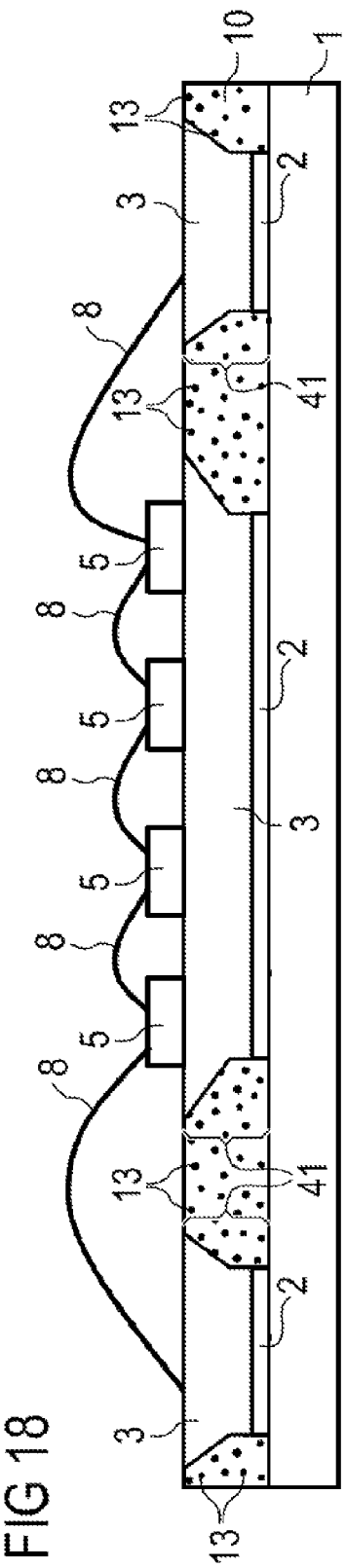

In the exemplary embodiment according to FIG. 18, a later component is created, which comprises multiple semiconductor bodies 5. The semiconductor bodies 5 are particularly preferably provided to emit electromagnetic radiation of different wavelength ranges. The wavelength ranges are particularly preferably selected such that the finished component emits white light in operation. The semiconductor bodies 5 are each applied on the rear in an electrically conductive manner with their mounting surface 7 to a shared contact structure element 41. On the front, the semiconductor bodies 5 are contacted with one another in an electrically conductive manner in each case using a bond wire 8. The two semiconductor bodies 5 which are arranged at the edge are each additionally connected in an electrically conductive manner on the front via a bond wire 8 to a further contact structure element 41. The semiconductor bodies 5 are serially powered in operation of the later component.

Figure 19:
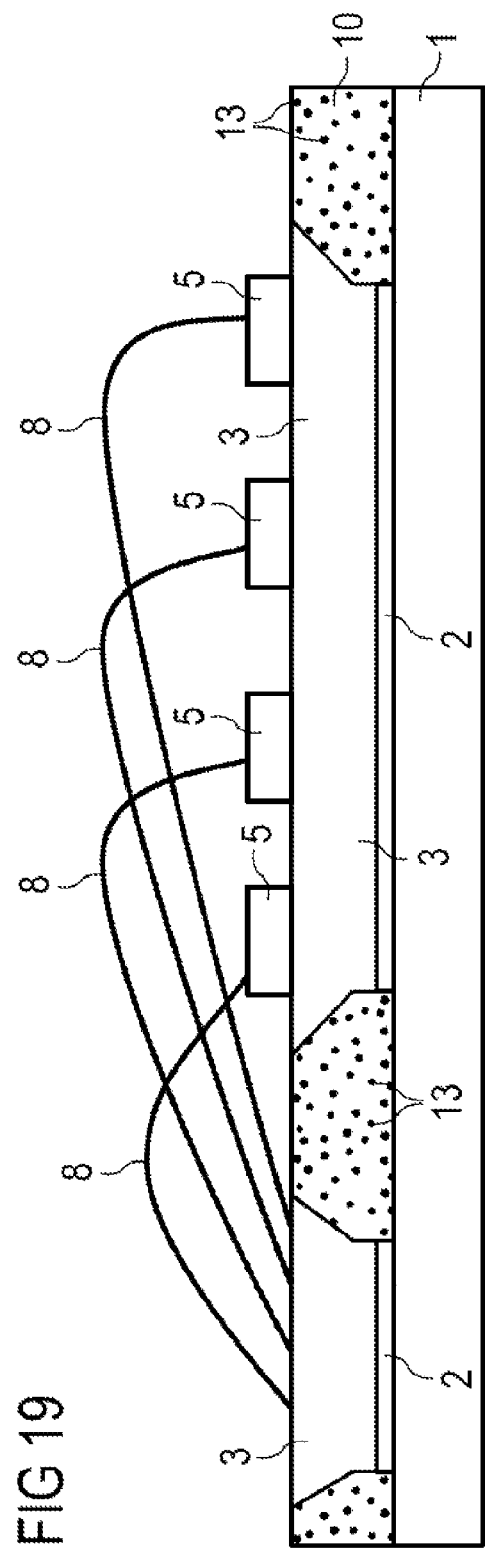

A component which has a plurality of semiconductor bodies 5 is also produced in the method according to the exemplary embodiment of FIG. 19. In contrast to the preceding exemplary embodiment, however, the semiconductor bodies 5 are electrically contacted in parallel. For this purpose, the semiconductor bodies 5 are each connected in an electrically conductive manner on the front via a bond wire 8 to a shared further contact structure element 41.

The present application claims the priority of German application DE 10 2013 100 711.2, the content of the disclosure of which is hereby incorporated by reference.

The invention is not restricted thereto by the description on the basis of the exemplary embodiments. Rather, the invention comprises every novel feature and every combination of features, which includes in particular every combination of features in the patent claims, even if this feature or this combination is not explicitly specified itself in the patent claims or exemplary embodiments.

The invention claimed is:

1. A method for producing a plurality of optoelectronic components having the following steps:
    providing an auxiliary carrier wafer having contact structures;
    applying a plurality of radiation-emitting semiconductor bodies to the contact structures;
    encapsulating the contact structures with a mechanically stabilizing material which terminates flush with a surface of the contact structures, the mechanically stabilizing material being a housing material;
    applying a potting mass to the surface, which is formed by the contact structures and the mechanically stabilizing material, such that the potting mass terminates flush with a front side of the semiconductor bodies; and
    removing the auxiliary carrier wafer.

2. The method according to claim 1, wherein the contact structures have a first metallic layer and a second metallic layer, wherein the second metallic layer is galvanically deposited on the first metallic layer.

3. The method according to claim 2, wherein the second metallic layer has lateral flanks having an undercut.

4. The method according to claim 1, wherein the potting mass is reflective and/or wavelength-converting.

5. The method according to claim 1, wherein the potting mass is applied using one of the following methods: casting, dispensing, jetting, molding.

6. The method according to claim 1, wherein the auxiliary carrier wafer is removed by one of the following methods: laser liftoff, etching, grinding.

7. The method according to claim 1, wherein a wavelength-converting layer is arranged in a light path of the semiconductor bodies.

8. The method according to claim 1, wherein an optical element is arranged in the light path of each semiconductor body.

9. The method according to claim 8, wherein the optical elements are molded above the semiconductor bodies.

10. The method according to claim 1, wherein the semiconductor bodies are implemented as flip-chips.

11. The method according to claim 1, wherein the semiconductor bodies have an electrical contact or at least two electrical contacts on their front side.

12. The method according to claim 1, wherein an upper edge of the potting mass extends up to an upper edge of the semiconductor bodies.

13. The method according to claim 1, wherein each later component has a plurality of semiconductor bodies.

14. An optoelectronic component, which is produced using a method according to claim 1.

15. A method for producing a plurality of optoelectronic components having the following steps:
    providing an auxiliary carrier wafer having contact structures;
    applying a plurality of radiation-emitting semiconductor bodies to the contact structures;
    encapsulating the contact structures with a mechanically stabilizing material which terminates flush with a surface of the contact structures, the mechanically stabilizing material being a housing material;
    applying a reflective potting mass to the surface, which is formed by the contact structures and the mechanically stabilizing material, such that the potting mass terminates flush with a front side of the semiconductor bodies; and
    removing the auxiliary carrier wafer.

* * * * *